(12) United States Patent
Obikane

(10) Patent No.: US 8,905,700 B2
(45) Date of Patent: Dec. 9, 2014

(54) TRANSFER AND INSPECTION DEVICES OF OBJECT TO BE INSPECTED

(75) Inventor: Tadashi Obikane, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 1554 days.

(21) Appl. No.: 12/049,717

(22) Filed: Mar. 17, 2008

(65) Prior Publication Data

US 2008/0240891 A1  Oct. 2, 2008

(30) Foreign Application Priority Data

Mar. 29, 2007  (JP) .................. 2007-088710

(51) Int. Cl.
*H01L 21/677* (2006.01)
*H01L 21/687* (2006.01)

(52) U.S. Cl.
CPC .... *H01L 21/68707* (2013.01); *H01L 21/67778* (2013.01); *Y10S 414/137* (2013.01)
USPC .......................................... 414/411; 414/937

(58) Field of Classification Search
CPC ................... H01L 21/67769; H01L 21/67733; H01L 21/67736; H01L 21/67772; G01R 31/2886; G01R 31/2887
USPC .................. 414/222.01, 411, 937; 324/158.1, 324/750.14, 765
See application file for complete search history.

(56) References Cited

U.S. PATENT DOCUMENTS

| 6,762,616 B2 * | 7/2004 | Kawaguchi et al. ...... 324/750.14 |
| 6,984,839 B2 * | 1/2006 | Igarashi et al. .......... 250/559.33 |
| 2003/0112002 A1 | 6/2003 | Kawaguchi et al. |

FOREIGN PATENT DOCUMENTS

| JP | 2-134579 | 5/1990 |
| JP | 10-289934 | 10/1998 |
| JP | 3388271 B2 | 3/2003 |
| JP | 2003-179109 | 6/2003 |

OTHER PUBLICATIONS

Japanese Office Action issued Mar. 29, 2011, in Patent Application No. 2007-088710 (with English-language translation of relevant parts).

* cited by examiner

*Primary Examiner* — Jonathan Snelting
(74) *Attorney, Agent, or Firm* — Oblon, Spivak, McClelland, Maier & Neustadt, L.L.P.

(57) ABSTRACT

An inspection apparatus includes an inspection chamber in which low-temperature inspection of an inspection object is performed; and a transfer chamber including therein a transfer device. The transfer device includes a transfer arm for transferring the inspection object to the inspection chamber; an arm-receiving compartment having a gateway via which the transfer arm is moved into or out of the arm-receiving compartment; and a gas supply means having a first and a second supply part for supplying a low-dew-point gas to the arm-receiving compartment from different locations. Herein, the first supply part is configured to supply the low-dew-point gas toward the inspection object introduced into the arm-receiving compartment by the transfer arm.

16 Claims, 3 Drawing Sheets

TRANSFER AND INSPECTION DEVICES OF OBJECT TO BE INSPECTED

FIELD OF THE INVENTION

The present invention relates to an inspection object transfer device and an inspection apparatus; and, more particularly, to an inspection object transfer device and an inspection apparatus, both of which are used in low-temperature inspection of an inspection object such as a semiconductor wafer or the like.

BACKGROUND OF THE INVENTION

As is known in the art, this kind of inspection apparatus typically includes a probe chamber for performing low-temperature inspection of an inspection object (e.g., a semiconductor wafer) and a loader chamber arranged adjacent to the probe chamber. The probe chamber includes a wafer chuck for holding a semiconductor wafer and controlling the temperature thereof; a probe card arranged above the wafer chuck; and an alignment mechanism for performing alignment of a plurality of probes of the probe card and a plurality of electrode pads of the semiconductor wafer. After aligning the semiconductor wafer, the probe chamber performs specified low-temperature inspection by bringing the semiconductor wafer, which is held on the wafer chuck at a low temperature of minus tens of degrees centigrade, into electrical contact with the probes of the probe card.

The loader chamber includes a storage part for storing a plurality of semiconductor wafers on a cassette-by-cassette basis; and a transfer device having a transfer arm that transfers the semiconductor wafers between the cassette and the probe chamber. Using the transfer arm, the semiconductor wafers are taken out from the cassette one by one, pre-aligned and then transferred to the probe chamber. Upon completion of the inspection, the semiconductor wafers are transferred from the probe chamber to an original position within the cassette.

In a conventional inspection apparatus for conducting low-temperature inspection within a probe chamber (see, for example, Patent Document 1), a dry air suitable for low-temperature inspection that has a low dew point to prevent dew condensation or ice formation on a semiconductor wafer is supplied into the probe chamber, keeping the inspection environment within the probe chamber in a low-dew-point environment. Once the low-temperature inspection is completed within the probe chamber, the semiconductor wafer thus inspected is transferred from a wafer chuck in the probe chamber to a loader chamber, and then is returned to a cassette by means of a transfer arm.

With the inspection apparatus disclosed in Patent Document 1, the semiconductor wafer for which inspection has been completed undergoes dew condensation or ice formation thereon while being transferred to the cassette. This is because the semiconductor wafer is transferred from the probe chamber kept in the low-dew-point environment to the cassette within the loader chamber in which the low-dew-point environment is unavailable. It is typical that the interior of the loader chamber and the cassette is maintained in an environment similar to that of a clean room, e.g., in an environment that exhibits a temperature of 25° C. and a humidity of 50% (a dew point of 13° C.).

As an effort to prevent dew condensation or ice formation on the semiconductor wafer within the cassette, the semiconductor wafer is lifted off from the wafer chuck in the probe chamber by elevating pins, and is made to wait there for a specified time. Then, the semiconductor wafer supported on the wafer chuck is transferred back to the cassette within the loader chamber by means of the transfer arm after the temperature of the semiconductor wafer reaches the dew point of the atmosphere in the loader chamber, so that dew is prevented from being formed on the semiconductor returned to the loader chamber. However, this requires a long period of waiting time for the semiconductor wafer to reach the dew point.

To avoid the above problems, there is proposed a technique in which a space kept in a low-dew-point environment is provided in a wafer transfer device to save the above-mentioned waiting time of the semiconductor wafer in the wafer chuck. The semiconductor wafer whose inspection is completed is immediately put into the low-dew-point environment of the wafer transfer device. Then, the temperature of the semiconductor wafer is returned to a temperature at which dew condensation does not occur on the semiconductor wafer within the cassette.

(Patent Document 1) Japanese Patent No. 3,388,271

However, even if the low-dew-point environment is provided in the wafer transfer device, the environment within the cassette is still similar to that of a clean room. Therefore, to transfer the semiconductor wafer inspected at a low temperature back to the cassette, the semiconductor wafer has to wait for a specified time in the low-dew-point environment of the wafer transfer device until the temperature thereof is restored to the dew point in the cassette.

It is a recent tendency to shorten the time required for low-temperature inspection. Therefore, if the semiconductor wafer is made to wait in the low-dew-point environment of the wafer transfer device until the temperature thereof is restored to the in-cassette dew point, it is sometimes the case that a time delay occurs in supplying the next semiconductor wafer. Another problem resides in that the waiting time in the low-dew-point environment needs to be set for every inspection on a case-by-case basis according to the length of the low-temperature inspection time.

SUMMARY OF THE INVENTION

In view of the above, the present invention provides an inspection object transfer device and an inspection apparatus capable of restoring the temperature of an inspection object having been inspected at a low temperature to a dew-condensation-free temperature within a time shorter than a typical transfer time, and thus facilitating the low-temperature inspection by returning the inspected inspection object back to its original position in the cassette without making the inspection object wait in the transfer device so that the next inspection object can be supplied in time even when the low-temperature inspection has been completed within a shorter time period.

In accordance with one aspect of the present invention, there is provided a transfer device including a transfer arm for transferring an inspection object to an inspection chamber in which low-temperature inspection is performed; an arm-receiving compartment having a gateway via which the transfer arm is moved into or out of the arm-receiving compartment; and a gas supply means having a first and a second supply part for supplying a low-dew-point gas to the arm-receiving compartment from different locations. Herein, the first supply part is adapted to supply the low-dew-point gas to the inspection object introduced into the arm-receiving compartment by the transfer arm.

It is preferable that the first supply part is located in the vicinity of the gateway of the arm-receiving compartment.

Further, it is preferable that the second supply part is located farther from the gateway than the first supply part.

Preferably, the low-dew-point gas is a dry air.

In accordance with one aspect of the present invention, there is provided an inspection apparatus including an inspection chamber in which low-temperature inspection of an inspection object is performed; and a transfer chamber including therein a transfer device. The transfer device includes a transfer arm for transferring the inspection object to the inspection chamber; an arm-receiving compartment having a gateway via which the transfer arm is moved into or out of the arm-receiving compartment; and a gas supply means having a first and a second supply part for supplying a low-dew-point gas to the arm-receiving compartment from different locations. Herein, the first supply part is adapted to supply the low-dew-point gas toward the inspection object introduced into the arm-receiving compartment by the transfer arm.

It is preferable that the first supply part is located in the vicinity of the gateway of the arm-receiving compartment.

Further, it is preferable that the second supply part is located farther from the gateway than the first supply part.

Further, it is preferable that the transfer chamber includes an air-tightly structured wall surface that encloses at least an installation space in which the transfer device is disposed.

Preferably, the low-dew-point gas is a dry air.

In accordance with the present invention, it is possible to provide an inspection object transfer device and an inspection apparatus capable of restoring the temperature of an inspection object having been inspected at a low temperature to a condensation-free temperature within a time shorter than a typical transfer time, and thus facilitating low-temperature inspection of the inspection object by transferring the inspected inspection object back to its original position without delay so that the next inspection object can be supplied in time even when the low-temperature inspection has been completed earlier than usual.

BRIEF DESCRIPTION OF THE DRAWINGS

The above features of the present invention will become apparent from the following description of the embodiments, given in conjunction with the accompanying drawings, in which.

DETAILED DESCRIPTION OF THE EMBODIMENT

Figure 1:
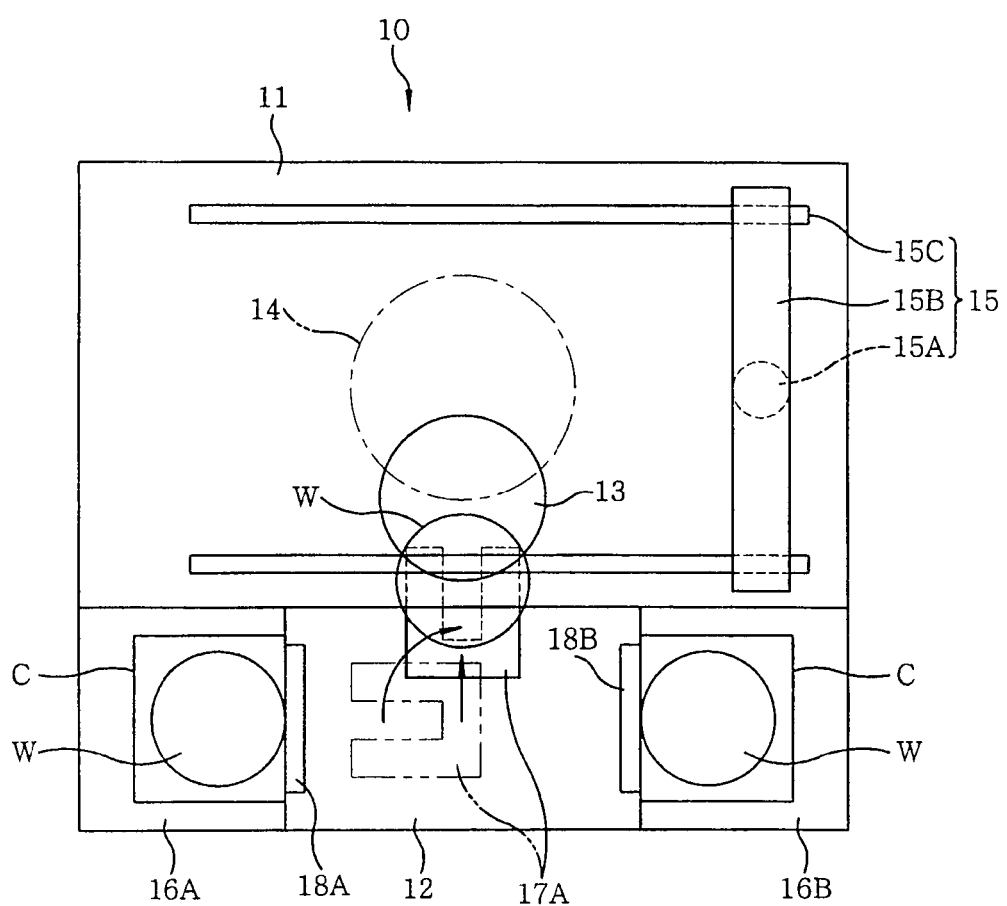
FIG. 1 is a plan view schematically showing an inspection apparatus in accordance with an embodiment of the present invention.
Figure 2:
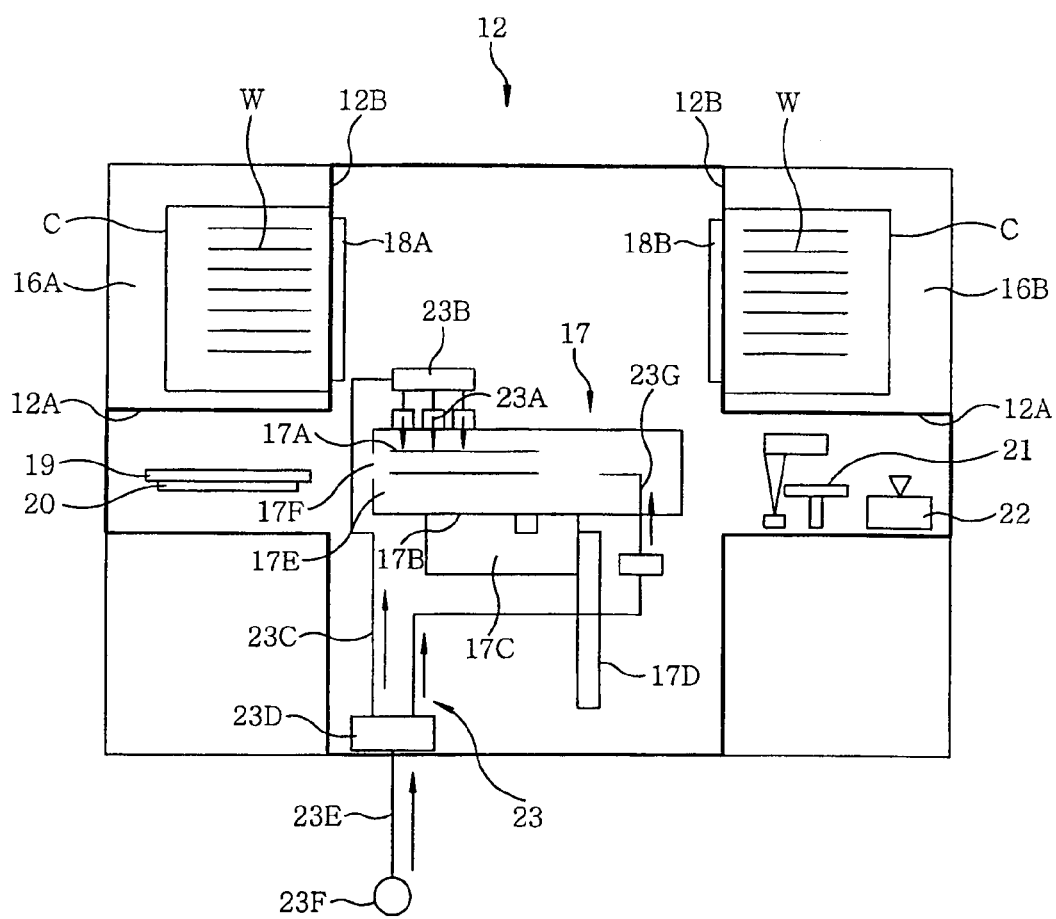
FIG. 2 is a configuration diagram illustrating a transfer chamber employed in the inspection apparatus shown in FIG. 1.
Figure 3A:
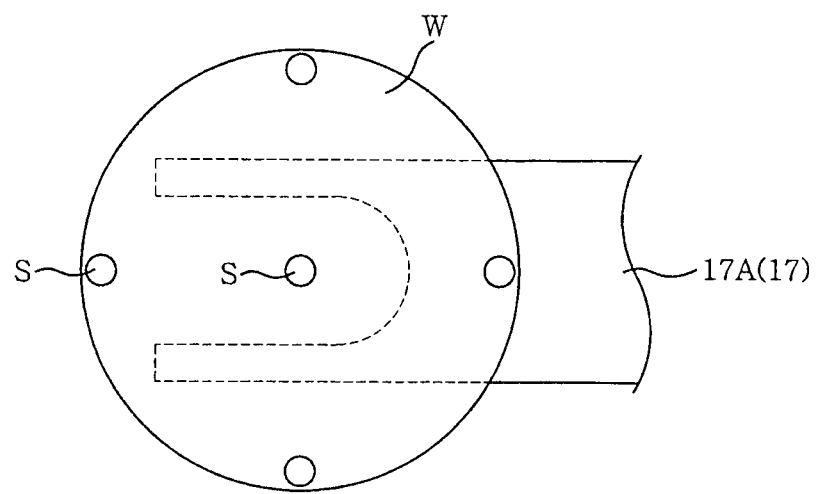
FIGS. 3A and 3B are a plan view and a side view, respectively, for depicting a case where the temperature of a semiconductor wafer is measured at different positions immediately after an inspection of the semiconductor is completed.
Figure 3B:
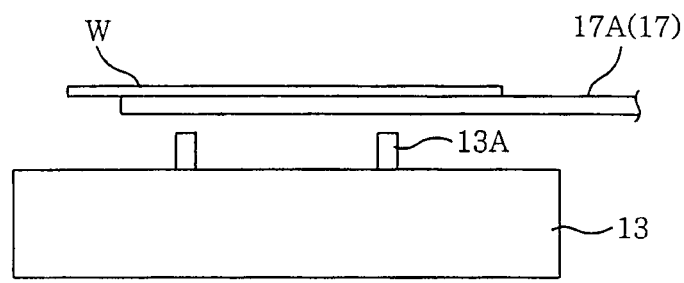

Hereinafter, the present invention will be described with reference to the embodiment shown in FIGS. 1 to 3. Herein, FIG. 1 is a plan view showing an inspection apparatus in accordance with an embodiment of the present invention; FIG. 2 is a configuration diagram illustrating a transfer chamber employed in the inspection apparatus shown in FIG. 1; and FIGS. 3A and 3B are a plan view and a side view, each depicting a case where the temperature of a semiconductor wafer is measured at different positions immediately after an inspection of the semiconductor is completed.

As shown in FIG. 1 by way of example, an inspection apparatus 10 of the present embodiment includes an inspection chamber (probe chamber) 11 for inspecting electrical characteristics of an inspection object (e.g., a semiconductor wafer) at a low temperature of minus tens of degrees centigrade (e.g., −30° C.); and a transfer chamber (loader chamber) 12 provided adjacent to the probe chamber 11 for transferring the inspection object. The left side in FIG. 1 corresponds to a front part of the inspection apparatus 10.

As shown therein, the probe chamber 11 includes a movable wafer chuck 13 for holding thereon a semiconductor wafer W, wherein the wafer chuck 13 has a temperature control mechanism for controlling the temperature of the semiconductor wafer W; a probe card 14 arranged above the wafer chuck 13; and an alignment mechanism 15 for bringing a plurality of probes (not shown) of the probe card 14 into alignment with the semiconductor wafer W supported on the wafer chuck 13.

A low-dew-point environment is created within the probe chamber 11 to protect the semiconductor wafer W from dew or ice formation thereon during the process of performing low-temperature inspection. The alignment mechanism 15 includes a camera 15A for capturing an image of the semiconductor wafer W supported on the wafer chuck 13; an alignment bridge 15B to which the camera 15A is attached; and a pair of guide rails 15C for guiding movement of the alignment bridge 15B between an initial position and a probe center (a position right below the center of the probe card).

In the probe chamber 11, the wafer chuck 13 is cooled down to a low temperature of, e.g., −30° C., under the control of a control unit. After the semiconductor wafer W is cooled by the wafer chuck 13 kept at the low temperature, the alignment mechanism 15 performs alignment between the semiconductor wafer W supported on the wafer chuck 13 and the plurality of probes of the probe card 14. Thereafter, the wafer chuck 13 is moved in X, Y and Z directions to bring electrode pads of the semiconductor wafer W into electrical contact with the plurality of probes of the probe card 14 corresponding thereto. In this state, electrical characteristics of the semiconductor wafer W are inspected.

Referring to FIG. 1, the loader chamber 12 includes a first and a second loading port 16A and 16B respectively arranged in a front and rear direction for holding cassettes C that receive therein a plurality of semiconductor wafers; and a wafer transfer device 17 (see FIG. 2) having a transfer arm 17A disposed between the first and the second loading port 16A and 16B. Various devices including the wafer transfer device 17 are operated under the control of a control unit (not shown). In the present embodiment, front opening unified pots (FOUPs) may be used as the cassettes C.

As illustrated in FIG. 2, the first and second loading ports 16A and 16B are partitioned from the wafer transfer device 17 by means of base plates 12A and partition walls 12B. Respectively provided in the partition walls 12B of the loading ports 16A and 16B are openers 18A and 18B for automatically opening and closing a cover of each of the front opening unified pots. Within a space existing below the first loading port 16A, a buffer table 19 and a wafer table 20 are arranged one above the other.

In a space existing below the second loading port 16B, there are provided a sub-chuck 21 for performing pre-alignment of the semiconductor wafer W and an information reading unit 22 for reading out identification information on the semiconductor wafer W. Prior to transferring the semiconductor wafer W to the probe chamber 11 by means of the transfer arm 17A, the sub-chuck 21 performs pre-alignment of the semiconductor wafer W; and, at the same time, the information reading unit 22 reads out identification information on the semiconductor wafer W.

The installation spaces of the various devices 19 to 22 are continuous with the installation space of the wafer transfer device 17, and are air-tightly separated from the first and the second loading port 16A and 16B as well as from other spaces by being enclosed by wall surfaces including the base plates 12A and the partition walls 12B as indicated by bold lines in FIG. 2. This means that the installation space of the wafer transfer device 17 is completely shielded from the first and second loading ports 16A and 16B and the like.

As can be seen in FIG. 2, the first and second loading ports 16A and 16B are of the same configuration, and are arranged to face each other such that the wafer transfer device 17 is interposed therebetween. For simplicity, only the first loading port 16A arranged in the front side (which corresponds to the left side in FIGS. 1 and 2) will be described herein below. For example, the first loading port 16A is provided with a rotary table for supporting the cassette C and a drive mechanism for driving the rotary table, both of which are not shown in the drawings, and is arranged on the base plate 12A as shown in FIG. 2. In the first loading port 16A, the cassette C is rotated by the rotary table, orienting a transfer port thereof toward the wafer transfer device 17.

As shown in FIG. 2, the wafer transfer device 17 of the present embodiment includes a transfer arm 17A provided above a base plate 17B capable of moving in a front-rear direction to transfer the semiconductor wafer W; a receiving part 17C provided below the base plate 17B for receiving therein a rotary drive unit (not shown) that rotates the transfer arm 17A via the base plate 17B; and an up-down drive unit 17D for lifting and lowering the transfer arm 17A together with the receiving part 17C. Provided above the base plate 17B is an arm-receiving compartment 17E for receiving the transfer arm 17A. On the front side of the arm-receiving compartment 17E is formed a gateway 17F via which the transfer arm 17A is moved into and out of the arm-receiving compartment 17E.

The transfer arm 17A is adapted to move via the gateway 17F during the process of transferring the semiconductor wafer W. As shown in FIG. 2, the transfer arm 17A includes upper and lower arm parts arranged one above the other. One of the arm parts is used in delivering the semiconductor wafer W to the probe chamber 11, whereas the other is used in returning the semiconductor wafer W from the probe chamber 11 at the end of inspection.

The wafer transfer device 17 further includes a gas supply unit 23 for supplying a gas (e.g., a dry air) having a low dew point into the arm-receiving compartment 17E. The gas supply unit 23 includes a first supply part (a plurality of gas ejecting holes) 23A provided on an upper surface of the arm-receiving compartment 17E near the gateway 17F; a distributor 23B for distributing the dry air to the gas ejecting holes 23A; a solenoid valve 23D connected to the distributor 23B via a first pipeline 23C; a dry air source 23F connected to the solenoid valve 23D via a second pipeline 23E; and a third pipeline 23G that connects the solenoid valve 23D to the arm-receiving compartment 17E to serve as a second supply part at an inside of the arm-receiving compartment 17E.

During low-temperature inspection, the third pipeline 23G is opened by the solenoid valve 23D, so that the dry air is supplied into the arm-receiving compartment 17E via the third pipeline 23G to thereby keep the arm-receiving compartment 17E in a low-dew-point environment (i.e., an environment where the dew point is lower than the temperature during the low-temperature inspection, e.g., −30° C.). When the semiconductor wafer W whose inspection has been completed is brought into the arm-receiving compartment 17E by means of the transfer arm 17A at the end of the low-temperature inspection, the control unit controls the solenoid valve 23D such that the dry air is supplied into the arm-receiving compartment 17E via the gas ejecting holes 23A and/or the third pipeline 23G, thereby allowing the dry air to be easily discharged outside via the gateway 17F.

Until and unless the dry air is supplied to the installation space of the wafer transfer device 17 via the third pipeline 23G, the installation space of the wafer transfer device 17 is kept in an environment similar to a clean room environment in which, e.g., the temperature is 25° C. and the humidity is 50% (and the dew point is 13° C.). However, after the dry air is supplied via the third pipeline 23G, the dew point is lowered to below 13° C. (for example, to 9° C.) as set forth later.

The time required for the low-temperature inspection of the semiconductor wafer W varies with the kind of the semiconductor wafer W. In the present embodiment, therefore, the method of supplying the dry air into the arm-receiving compartment 17E from the gas supply unit 23 is changed depending on the low-temperature inspection time, as will be described later. However, regardless of the method of supplying the dry air, the wafer temperature is raised up within a typical transfer time to a temperature at which no dew condensation occurs in the cassette C without making the inspected semiconductor wafer W wait for a time longer than the inspection time in the arm receiving compartment 17E. Therefore, it is not necessary to have the semiconductor wafer W wait for an extra time within the arm-receiving compartment 17E.

In case the low-temperature inspection time is longer than the time required for the wafer temperature in the arm-receiving compartment 17E to be increased by supplying the dry air from the temperature immediately after the inspection to the dew point temperature of the atmosphere in the cassette, it is possible to raise the temperature of the semiconductor wafer W whose inspection has been completed up to the in-cassette dew point merely by supplying the dry air into the arm-receiving compartment 17E via the third pipeline 23G alone. This makes it possible to transfer the semiconductor wafer W back to the cassette C at the moment when the wafer temperature is restored to the in-cassette dew point in the arm-receiving compartment 17E.

However, in case the low-temperature inspection time is shorter than the time required for the wafer temperature in the arm-receiving compartment 17E to be increased by supplying the dry air from the temperature immediately after the inspection to the dew point temperature of the atmosphere in the cassette, the wafer temperature cannot be raised up to the dew point within a time shorter than the low-temperature inspection time by supplying the dry air into the arm-receiving compartment 17E via the third pipeline 23G alone.

In this case, the temperature increase of the semiconductor wafer W needs to be accelerated by ejecting the dry air via the gas ejecting holes 23A of the gas supply unit 23 onto the inspected semiconductor wafer W on the transfer arm 17A. By doing so, the wafer temperature can be increased to the in-cassette dew point within a time for transferring the semiconductor wafer W from the probe chamber 11 to the cassette C. This makes it possible to transfer the semiconductor wafer W back to the cassette C without a waiting time in the arm-receiving compartment 17E after the completion of the inspection.

There may be cases where the wafer temperature is not increased to the in-cassette dew point within a time for transferring the semiconductor wafer W from the probe chamber 11 to the cassette C by supplying the dry air from the gas ejecting holes 23A. In this case, the semiconductor wafer W is transferred from the arm-receiving compartment 17E to the cassette C at the wafer temperature reached within the transferring time.

Since the installation space of the wafer transfer device 17 is maintained in a low-dew-point environment that exhibits a temperature of about 9° C. lower than the ordinary in-cassette dew point (13° C.), there is little possibility that dew condensation occurs in the semiconductor wafer W during the process of transferring the semiconductor wafer W from the arm-receiving compartment 17E to the cassette C. Furthermore, in case a front opening unified pot (FOUP) whose internal environment is the same as that of the installation space of the wafer transfer device 17 is used as the cassette C, there is also little possibility that dew condensation occurs in the semiconductor wafer W when the semiconductor wafer W is transferred from the arm-receiving compartment 17E to the front opening unified pot.

In other words, it is possible to increase the temperature of the semiconductor wafer W to a condensation-free temperature within a typical wafer transferring time.

In any of the cases described above, within a time for transferring the semiconductor wafer W from the probe chamber 11 to the cassette C, the wafer temperature can be increased to a temperature at which dew condensation does not occur in the semiconductor wafer W. This eliminates the need to set an extra time for which the semiconductor wafer W waits in the arm-receiving compartment 17E.

The temperature change from the right-after-inspection temperature to the dew point of the atmosphere in the cassette can be traced by conducting a measurement in a manner as illustrated in FIGS. 3A and 3B. Referring to FIG. 3A, temperature sensors S are attached to the semiconductor wafer W at the center, left, right, upper and lower portions thereof. Measurement signals of the temperature sensors S are transmitted to the control unit, e.g., on an online basis. Based on the measurement signals, the control unit records and stores the temperature values measured in the respective portions together with the lapse of time.

In order to measure the temperature of the semiconductor wafer W using the five temperature sensors S, the semiconductor wafer W is moved up away from the support surface by means of elevating pins 13A and then is taken by the transfer arm 17A. The temperature measured at this time is recorded as a right-after-inspection temperature. During the process of transferring the semiconductor wafer W to the arm-receiving compartment 17E by use of the transfer arm 17A, the temperature of the semiconductor wafer W is repeatedly measured in the aforementioned five points. The temperature values thus measured are transmitted to and recorded in the control unit on an online basis. The temperature change of the semiconductor wafer W is recorded in respect of a case that the dry air is supplied into the arm-receiving compartment 17E only via the third pipeline 23G and another case that the dry air is supplied into the arm-receiving compartment 17E both via the third pipeline 23G and via the gas ejecting holes 23A. The sequence of supplying the dry air can be determined based on the measurement data and the inspection time.

Next, description will be made on operations of the present inspection apparatus. Referring to FIGS. 1 and 2, upon operation of the wafer transfer device 17, the transfer arm 17A takes out the semiconductor wafer W from the cassette C of the first loading port 16A. Then, the transfer arm 17A is rotated 180 degrees to transfer the semiconductor wafer W to the installation space of the sub-chuck 20. The semiconductor wafer W is pre-aligned by the sub-chuck 20 and identified by the information reading unit 22. Thereafter, the transfer arm 17A is rotated 90 degrees counterclockwise to pass the semiconductor wafer W to the wafer chuck 13 arranged within the probe chamber 11. Because the wafer chuck 13 is kept at a temperature of −30° C., the semiconductor wafer W is cooled by the wafer chuck 13.

During this process, the gas supply unit 23 is operated together with the wafer transfer device 17. The gas supply unit 23 supplies the dry air into the arm-receiving compartment 17E via the solenoid valve 23D and the third pipeline 23G, thereby creating a low-dew-point environment within the arm-receiving compartment 17E.

In the probe chamber 11, the wafer chuck 13 and the alignment mechanism 15 cooperate with each other to align the semiconductor wafer W and the probes of the probe card 14. During this process, the semiconductor wafer W is cooled down to a preset temperature of about −30° C. by means of the wafer chuck 13. After performing the alignment, low-temperature inspection of the semiconductor wafer W is performed in a specified order. At the end of the low-temperature inspection, one of the arm parts in the transfer arm 17A takes up a pre-aligned next semiconductor wafer W. Further, the other of the arm parts in the transfer arm 17A takes the inspected semiconductor wafer W from the wafer chuck 13 in the probe chamber 11, and brings it into the arm-receiving compartment 17E. Then, after the next semiconductor wafer W is transferred to the wafer chuck 13, the involved arm part (i.e., said one of the arm parts) is accommodated in the arm-receiving compartment 17E.

At this time, the control unit controls the gas supply unit 23, and switches the solenoid valve 23D such that the dry air is ejected from the gas ejecting holes 23A onto the semiconductor wafer W in the arm-receiving compartment 17E. Thus, the temperature of the semiconductor wafer W accommodated within the arm-receiving compartment 17E is gradually increased due to the difference in temperature between the semiconductor wafer W and the dry air. Once the wafer temperature reaches the dew point (13° C.) within a typical transfer time of the semiconductor wafer W, the semiconductor wafer W is transferred back to the cassette C as it stands.

Further, even if the wafer temperature fails to reach the dew point (13° C.) within a typical transfer time, the semiconductor wafer W is transferred from the arm-receiving compartment 17E back to the cassette C. Meanwhile, the installation space of the wafer transfer device 17 is maintained in a low-dew-point environment by the dry air flowing out of the arm-receiving compartment 17E, and the internal space of the cassette C is also kept in a low-dew-point environment like the environment created in the installation space of the wafer transfer device 17.

In this manner, dew condensation is prevented in the semiconductor wafer W when the semiconductor wafer W is transferred from the arm-receiving compartment 17E to the cassette C.

By changing the method of supplying the dry air to the arm-receiving compartment 17E from the gas supply unit 23 according to the length of the low-temperature inspection time of the semiconductor wafer W as set forth above, it becomes possible to reliably prevent dew condensation on the semiconductor wafer W, and the quantity of dry air used can be saved as well.

In the present embodiment described hereinabove, the wafer transfer device 17 includes the arm-receiving compartment 17E having the gateway 17F via which the transfer arm 17A is moved into and out of the arm-receiving compartment 17E. The gas supply unit 23 includes the gas ejecting holes 23A and the third pipeline 23G configured to supply the dry air into the arm-receiving compartment 17E from different locations. The dry air is ejected from the gas ejecting holes 23A toward the semiconductor wafer W (preferably, onto the upper surface of the semiconductor wafer W; and, more preferably, onto the upper surface of the semiconductor wafer W in a direction substantially vertical thereto) transferred into the arm-receiving compartment 17E by the transfer arm 17A.

In this manner, the increase in the wafer temperature is accelerated by the dry air supplied from the gas ejecting holes 23A, which makes it possible to restore the temperature of the semiconductor wafer W to a condensation-free temperature within the wafer transfer time. Thus, it is possible to facilitate the low-temperature inspection by transferring the inspected inspection object back to the cassette C and supplying the next semiconductor wafer W to the probe chamber 11 without delay. Because the wafer temperature can be increased from an end-of-inspection temperature to an in-cassette dew point temperature within a typical transfer time, it is not necessary to have the semiconductor wafer W wait in the arm-receiving compartment 17E, nor is necessary to set a waiting time on a case-by-case basis.

In the present embodiment, the gas ejecting holes 23A are provided in the vicinity of the gateway 17F of the arm-receiving compartment 17E. This makes it possible to restore the temperature of the inspected semiconductor wafer W to a condensation-free temperature more efficiently. Furthermore, by arranging a gas ejecting nozzle of the third pipeline 23G deep inside the arm-receiving compartment 17E (i.e., at least farther from the gateway 17F than the gas ejecting holes 23A), a low-dew-point environment can be created in the arm-receiving compartment 17E more reliably.

The present invention is not limited to the embodiment described above. If necessary, each of the components may be changed or modified as desired. Although the dry air is used as a low-dew-point gas in the foregoing embodiment, a chemically inert gas such as a nitrogen gas or the like may be used instead according to the kind of an inspection object.

The present invention can be properly used in a probe apparatus for performing low-temperature inspection of an inspection object such as a semiconductor wafer or the like.

While the invention has been shown and described with respect to the embodiments, it will be understood by those skilled in the art that various changes and modifications may be made without departing from the scope of the invention as defined in the following claims.

What is claimed is:

1. A transfer device comprising:
   a transfer arm configured to transfer an inspection object between a cassette for carrying the inspection object and an inspection chamber in which low-temperature inspection is performed;
   an arm-receiving compartment including a gateway via which the transfer arm is moved into or out of the arm-receiving compartment;
   a gas supply means including a first and a second supply part configured to supply a low-dew-point gas to the arm-receiving compartment from different locations;
   an air-tightly structured housing including therein an installation space in which the transfer arm and the arm-receiving compartment are disposed; and
   an up-down drive unit for lifting and lowering the transfer arm,
   wherein the first supply part is configured to supply the low-dew-point gas toward the inspection object introduced into the arm-receiving compartment by the transfer arm,
   wherein the low-dew-point gas is discharged from the arm-receiving compartment via the gateway,
   wherein the housing is configured such that the installation space and an inner space of the cassette are completely sealed from each other,
   wherein an opening and closing device disposed on a partition wall of a loading port holding the cassette allows communication of the inspection object between the inner space of the cassette and the installation space, and
   wherein the first supply part includes one or more gas ejecting holes configured to eject the low-dew-point gas onto an upper surface of the inspection object in a direction substantially vertical to the upper surface.

2. The transfer device of claim 1, wherein the first supply part is located in the vicinity of the gateway of the arm-receiving compartment.

3. The transfer device of claim 1, wherein the second supply part is located farther from the gateway than the first supply part.

4. The transfer device of claim 1, wherein the low-dew-point gas is a dry air.

5. The transfer device of claim 1, wherein the housing is configured such that the installation space is shielded from a loading port holding the cassette.

6. An inspection apparatus comprising:
   an inspection chamber in which low-temperature inspection of an inspection object is performed; and
   a transfer chamber including a transfer device,
   wherein the transfer device includes:
      a transfer arm configured to transfer the inspection object between a cassette for carrying the inspection object and the inspection chamber;
      an arm-receiving compartment having a gateway via which the transfer arm is moved into or out of the arm-receiving compartment;
      a gas supply means having a first and a second supply part configured to supply a low-dew-point gas to the arm-receiving compartment from different locations;
      an air-tightly structured housing having therein an installation space in which the transfer arm and the arm-receiving compartment are installed; and
   an up-down drive unit for lifting and lowering the transfer arm,
   wherein the first supply part is configured to supply the low-dew-point gas toward the inspection object introduced into the arm-receiving compartment by the transfer arm,
   wherein the low-dew-point gas is discharged from the arm-receiving compartment via the gateway,
   wherein the housing is configured such that the installation space and an inner space of the cassette are completely sealed from each other,
   wherein an opening and closing device disposed on a partition wall of a loading port holding the cassette allows communication of the inspection object between the inner space of the cassette and the installation space, and
   wherein the first supply part includes one or more gas ejecting holes configured to eject the low-dew-point gas onto an upper surface of the inspection object in a direction substantially vertical to the upper surface.

7. The inspection apparatus of claim 6, wherein the first supply part is located in the vicinity of the gateway of the arm-receiving compartment.

8. The inspection apparatus of claim 6, wherein the second supply part is located farther from the gateway than the first supply part.

9. The inspection apparatus of claim 6, wherein the low-dew-point gas is a dry air.

10. The inspection apparatus of claim 6, wherein the housing is configured such that the installation space is shielded from a loading port holding the cassette.

11. A transfer device comprising:
a transfer arm configured to transfer an inspection object between a cassette for carrying the inspection object and an inspection chamber in which low-temperature inspection is performed;
an arm-receiving compartment including a gateway via which the transfer arm is moved into or out of the arm-receiving compartment;
a gas supply means including a first and a second supply part configured to supply a low-dew-point gas to the arm-receiving compartment from different locations;
an air-tightly structured housing including therein an installation space in which the transfer arm and the arm-receiving compartment are disposed; and
an up-down drive unit for lifting and lowering the transfer arm,
wherein the first supply part is configured to selectively supply the low-dew-point gas toward the inspection object introduced into the arm-receiving compartment by the transfer arm,
wherein the low-dew-point gas is discharged from the arm-receiving compartment via the gateway,
wherein the housing is configured such that the installation space and an inner space of the cassette are completely sealed from each other,
wherein an opening and closing device disposed on a partition wall of a loading port holding the cassette allows communication of the inspection object between the inner space of the cassette and the installation space, and
wherein the first supply part includes one or more gas ejecting holes configured to eject the low-dew-point gas onto an upper surface of the inspection object in a direction substantially vertical to the upper surface.

12. The transfer device of claim 11, further comprising a temperature sensor to measure a temperature of the inspection object transferred from the inspection chamber and the first supply part is configured to supply the low-dew-point gas into the arm-receiving compartment when a time required for performing low-temperature inspection of another inspection object in the inspection chamber is shorter than a time required for heating, by supplying the low-dew-point gas only from the second supply part, the inspection object transferred from the inspection chamber to a dew point temperature of an atmosphere in the cassette, the time required for heating being determined by the measured temperature obtained by the temperature sensor.

13. The transfer device of claim 11, wherein the housing is configured such that the installation space is shielded from a loading port holding the cassette.

14. An inspection apparatus comprising:
an inspection chamber in which low-temperature inspection of an inspection object is performed; and
a transfer chamber including a transfer device,
wherein the transfer device includes:
transfer arm configured to transfer the inspection object between a cassette for carrying the inspection object and the inspection chamber;
an arm-receiving compartment having a gateway via which the transfer arm is moved into or out of the arm-receiving compartment;
a gas supply means having a first and a second supply part configured to supply a low-dew-point gas to the arm-receiving compartment from different locations;
an air-tightly structured housing having therein an installation space in which the transfer arm and the arm-receiving compartment are installed; and
an up-down drive unit for lifting and lowering the transfer arm,
wherein the first supply part is configured to selectively supply the low-dew-point gas toward the inspection object introduced into the arm-receiving compartment by the transfer arm,
wherein the low-dew-point gas is discharged from the arm-receiving compartment via the gateway,
wherein the housing is configured such that the installation space and an inner space of the cassette are completely sealed from each other,
wherein an opening and closing device disposed on a partition wall of a loading port holding the cassette allows communication of the inspection object between the inner space of the cassette and the installation space, and
wherein the first supply part includes one or more gas ejecting holes configured to eject the low-dew-point gas onto an upper surface of the inspection object in a direction substantially vertical to the upper surface.

15. The inspection apparatus of claim 14, further comprising a temperature sensor to measure a temperature of the inspection object transferred from the inspection chamber and the first supply part is configured to supply the low-dew-point gas into the arm-receiving compartment when a time required for performing low-temperature inspection of another inspection object in the inspection chamber is shorter than a time required for heating, by supplying the low-dew-point gas only from the second supply part, the inspection object transferred from the inspection chamber to a dew point temperature of an atmosphere in the cassette, the time required for heating being determined by the measured temperature obtained by the temperature sensor.

16. The inspection apparatus of claim 14, wherein the housing is configured such that the installation space is shielded from a loading port holding the cassette.

* * * * *